United States Patent
Wernlund et al.

(10) Patent No.: US 6,519,949 B1
(45) Date of Patent: Feb. 18, 2003

(54) DUAL PULSE WIDTH MODULATED DRIVER FOR THERMO-ELECTRIC COOLER

(75) Inventors: James Vincent Wernlund, Indialantic, FL (US); James Allan Wilkerson, Jr., Satellite Beach, FL (US); Dimitrios Nikolaidis, Melbourne, FL (US)

(73) Assignee: JDS Uniphase Corporation, San Jose, CA (US)

( * ) Notice: Subject to any disclaimer, the term of this patent is extended or adjusted under 35 U.S.C. 154(b) by 206 days.

(21) Appl. No.: 09/712,830

(22) Filed: Nov. 13, 2000

(51) Int. Cl.$^7$ ............................................... F25B 21/02
(52) U.S. Cl. ............................ 62/3.7; 62/159; 372/34
(58) Field of Search ........................... 62/3.7, 214, 159; 165/255, 259; 372/34, 36, 38, 25, 29; 323/271

(56) References Cited

U.S. PATENT DOCUMENTS

| | | | |
|---|---|---|---|
| 4,631,728 A | 12/1986 | Simons | 372/38 |
| 4,792,957 A | 12/1988 | Kollanyi | 372/34 |
| 5,088,098 A | 2/1992 | Muller et al. | 372/34 |
| 5,118,964 A | 6/1992 | McArdle | 307/117 |
| 5,450,727 A | 9/1995 | Ramirez et al. | 62/3.7 |
| 5,602,860 A | 2/1997 | Masonson | 372/34 |
| 5,689,957 A * | 11/1997 | DeVilbiss et al. | 62/3.7 |
| 6,205,790 B1 * | 3/2001 | Denkin et al. | 62/3.7 |

* cited by examiner

Primary Examiner—Chen-Wen Jiang
(74) Attorney, Agent, or Firm—Allen, Dyer, Doppelt, Milbrath & Gilchrist, P.A.

(57) ABSTRACT

A dual pulse width modulated driver controls the operation of a thermo-electric cooler for stabilizing the operating temperature of a laser. The pulse width modulator has complementary outputs coupled to control inputs of dual pairs of complementary polarity electronic switching elements, that are coupled in circuit between first and second power supply terminals, and a pair of output nodes. The output nodes are coupled in common through a low pass filters to drive terminals of a thermoelectric cooling element. The thermal output generated by the thermoelectric cooling element is coupled to the laser. The thermal output of the cooling element is monitored by a temperature sensing element mounted with the laser and provides an output voltage in linear proportion of its thermal input. This output voltage is fed back through a temperature control servo loop to a differential summing circuit, which is also coupled to receive a reference voltage used to control the duty cycle of the pulse width modulator. The output of the differential summing circuit is filtered through a low pass loop filter to eliminate the modulator's switching frequency component in the voltage fed back from the thermistor.

17 Claims, 1 Drawing Sheet

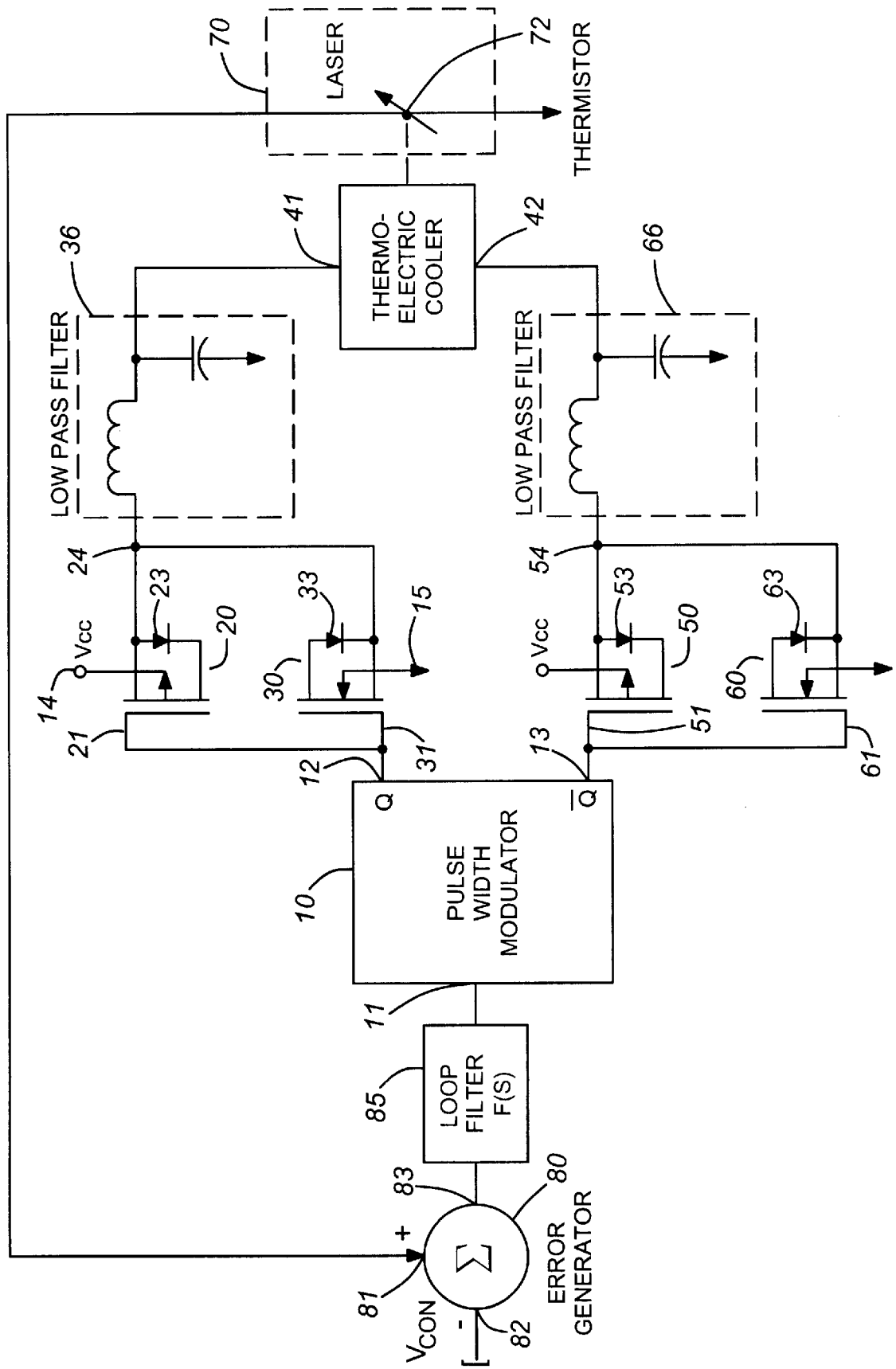

DUAL PULSE WIDTH MODULATED DRIVER FOR THERMO-ELECTRIC COOLER

FIELD OF THE INVENTION

The present invention relates in general to communication systems and components therefor, and is particularly directed to a highly efficient, dual pulse width modulated driver for controlling the operation of a thermo-electric cooler, such as may be used for stabilizing the operating temperature of a laser employed in a digital optical transmitter for a very high data rate (e.g., on the order of 10 Gb/s or higher) communication system.

BACKGROUND OF THE INVENTION

In order to maintain wavelength stability and reliability, as well as comply with intended performance specification of a component, such as a laser employed in a very high data rate (e.g., on the order of 10 Gb/s or higher) digital optical transmitter, it is common practice to thermally couple the laser with an associated thermo-electric cooling unit. Conventional techniques for controlling the current through and thereby the cooling/heating of the component provided the thermoelectric cooler include the use of 'H'-switched bridge circuits and extremely linear (and therefore costly) voltage sources. Unfortunately, at best, these prior art schemes are capable of achieving an efficiency of only 47%, which results in substantial power dissipation in the laser transmitter's heat sink, particularly at high temperature operation. For an illustration of non-limiting examples of patent literature describing prior art control circuits for thermo-electric coolers, attention may be directed to the following U.S. Pat. Nos.: 5,602,860; 5,088,098; 4,631,728; 5,450,727; 4,792,957; and 5,118,964.

SUMMARY OF THE INVENTION

Pursuant to the present invention, rather than having to dissipate wasted power in the laser driver circuitry, thermo-electric cooler operation is controlled by using a class D-type device, in particular, a pulse width modulator-based driver arrangement that has an efficiency approaching 100% and generates a signal waveform having a duty cycle that is linearly proportional to a control voltage. This signal waveform is coupled to an interface circuit that is coupled to a power supply for operating the thermoelectric cooler, and is operative to apply a differential powering voltage across drive inputs of the thermo-electric cooling element in linear proportion to the duty cycle of the signal waveform generated by the pulse width modulator, so that the thermal characteristic of the thermo-electric cooling element is linearly proportional to the duty cycle of the signal waveform.

In accordance with a non-limiting but preferred embodiment, the pulse width modulator has complementary outputs coupled to control inputs of dual pairs of complementary polarity electronic switching elements, such as pairs of opposite polarity channel field effect transistors, that are coupled in circuit between first and second power supply terminals and a pair of complementary output nodes. The complementary output nodes are coupled in common through a low pass filters to opposite powering inputs of the thermo-electric cooling element. The thermal output generated by the thermoelectric cooling element is coupled to a temperature stabilized device (e.g., laser), and is monitored by a temperature sensing element, such as a thermistor mounted on the surface of the device (laser). The thermistor provides a thermal sensor output voltage in linear proportion of its thermal input, which is fed back through a temperature control servo loop to a differential summing circuit, and combined with a reference voltage used to control the duty cycle of the pulse width modulator. The output of the differential summing circuit is coupled to the modulator through a low pass loop filter to eliminate the modulator's switching frequency component in the fed back sensor output voltage from the thermistor. In operation, the pulse width modulator operates as a class D-type driver, generating a pair of complementary switching signal waveforms in linear proportion to its DC input voltage. For a 50% duty cycle, the voltage levels of the complementary switching waveforms will be evenly split for each cycle, so that each of the thermo-electric cooling element's drive inputs will see the same DC voltage, resulting in a zero DC volt differential across the thermo-electric cooling element, and a corresponding zero drive current being imparted to the thermo-electric cooler. This differentially based zero drive eliminates the 'dead zone' around zero current present with a conventional arrangement of a linear driver and a switch bridge, resulting from errors in current direction control circuitry.

For an input voltage to the pulse width modulator that changes the duty cycle from 50%, the duty cycle of one of the modulator's signal waveform outputs will linearly change (e.g., increase) in a complementary manner relative to the linear change (e.g., decrease) in the duty cycle of its other (complementary) signal waveform output. This causes different percentages of the difference between the power supply rails to be applied to the respective drive inputs of the thermo-electric cooling element, and thereby creating a non-zero voltage differential across the thermo-electric cooler. Such complementary apportioning of the difference between the power supply rails as the drive inputs to the thermo-electric cooler makes control of the thermo-electric cooler effectively insensitive to fluctuations in the power supply voltages. Namely, the thermal output of the thermo-electric cooling element (heating or cooling) can be very accurately (and linearly) controlled in accordance with an increase or decrease in the duty cycle of the pulse width modulator.

BRIEF DESCRIPTION OF THE DRAWINGS

The single FIGURE diagrammatically illustrates a dual pulse width modulated driver for a thermo-electric cooler in accordance with an embodiment of the present invention.

DETAILED DESCRIPTION

Before describing in detail the dual pulse width modulated thermo-electric cooler driver of the present invention, it should be observed that the invention resides primarily in a prescribed modular arrangement of conventional electronic circuits and components. In a practical implementation that facilitates their incorporation with existing laser equipment, such as that used in high data rate telecommunication systems, and the like, this arrangement may be readily implemented in an application specific integrated circuit (ASIC) chip. As a consequence, the configuration of such an arrangement of circuits and components have, for the most part, been illustrated in the single Figure as a readily understandable circuit diagram, which shows only those specific details that are pertinent to the present invention, so as not to obscure the disclosure with details which will be readily apparent to those skilled in the art having the benefit of the description herein. Thus, the single Figure is primarily intended to show the major components of the invention in a convenient functional grouping, that will facilitate its understanding.

The overall configuration of the dual pulse width modulated thermo-electric cooler driver of the present invention is shown diagrammatically in the single Figure as comprising a pulse width modulator (PWM) 10 having a control voltage input port 11 to which a DC control voltage for controlling the duty cycle of the PWM is applied. The PWM 10 has a first, Q output 12 coupled to the control (e.g., gate) inputs 21 and 31 of a first pair of first and second complementary polarity electronic switching elements 20 and 30, that are respectively coupled in circuit with a first DC power supply terminal 14 to which a first DC voltage (e.g., Vcc) is applied, and with a second DC power supply terminal 15 to which a second reference voltage (e.g., ground (GND)) is applied. The PWM 10 also has a second (QBAR) output 13 coupled to the control (e.g., gate) inputs 51 and 61 of a second pair of third and fourth complementary polarity electronic switching elements 50 and 60, that are also respectively coupled in circuit with DC power supply terminal 14 and the GND supply terminal 15.

As a non-limiting example, the first switching element 20 is shown as a P-channel field effect transistor (FET), having its gate 21 coupled to the Q output 12 of PWM 10 and its substrate coupled to the Vcc terminal. The source and drain of the FET 20 are interconnected through a diode 23, and coupled to an output node 24. In a complementary manner, the second switching element 30 is shown as an N-channel field effect transistor (FET), having its gate 31 coupled to the Q output 12 of the PWM 10 and its substrate coupled to the GND terminal 15. The source and drain of the FET 30 are interconnected through a diode 33, and coupled to output node 24. The output node 24 is coupled through a first low pass filter 36 to a first terminal 41 of a thermo-electric cooling element 40.

The second pair of complementary switching elements includes the third switching element 50, shown as a P-channel field effect transistor (FET), having its gate 51 coupled to the QBAR output 13 of the PWM 10 and its substrate coupled to the Vcc terminal 14. The source and drain of the FET 50 are interconnected through a diode 53, and coupled to an output node 54. The fourth switching element 60 is shown as an N-channel field effect transistor (FET), having its gate 61 coupled to the QBAR output 13 of the PWM 10 and its substrate coupled to the GND terminal. The source and drain of the FET 60 are interconnected through a diode 63, and coupled to output node 54. The output node 54 is coupled through a second low pass filter 66 to a second terminal 42 of the thermo-electric cooling element 40.

The thermal output generated by the thermo-electric cooling element 40 is coupled to an temperature stabilized device, here a laser 70, the temperature of which is to be controlled. In order to monitor the thermal output of the cooling element 40 its output is sensed by means of an element such as a thermistor 72 mounted on the surface of the device (laser) to be controlled by the thermo-electric cooler, that provides an output voltage in linear proportion of its thermal input. This output voltage is fed back to a first input 81 of a differential summing circuit 80, a second input 82 of which is coupled to receive a prescribed control voltage Vcon. Summing circuit 80 serves an an error voltage generator, and has an output 83 that provides a DC voltage representative of the voltage difference between the input voltage Vcon and the thermistor output voltage. This error output voltage is coupled through a low pass loop filter 85 to supply a DC control voltage to input 11 of the PWM 10. The low pass filter 85 serves to eliminate the switching frequency component associated with the fed back output from the thermistor 72.

In operation, the PWM 10 operates as a class D-type driver, and is operative to generate an output switching signal (e.g., a square wave) at some frequency based upon the designed oscillation parameters of the PWM's internal control circuit. The duty cycle of each of the PWM's complementary output square waves produced at its Q and QBAR output ports 12 and 13 is linearly proportionally to the DC input voltage applied to its input port 11. For a 50% duty cycle output waveform, the signal levels of the complementary signal waveforms at its Q and QBAR output ports 12 and 13, respectively, will be evenly split (between Vcc and GND) for each cycle, so that each of the thermoelectric cooling element's terminals 41 and 42 will see the same DC voltage of Vcc/2, yielding a DC voltage differential across the thermoelectric cooling element 40 of zero volts. As noted earlier, the present invention's use of a differentially based zero drive liminates the 'dead zone' around zero current in a conventional linear driver and a switch bridge arrangement resulting from errors in current direction control circuitry. For an input voltage to the PWM 10 that produces a duty cycle other than 50W, the duty cycle of the version of the PWM signal waveform produced at the Q output 12 of the PWM 10 will change (e.g., increase) in linear proportion to that control voltage in a manner that is complementary to the duty cycle change (e.g., decrease) of the version of the PWM signal waveform produced at the QBAR output 13. This opposite change in duty cycles of the two waveforms causes the differential voltage across the thermo-electric cooling element 40 to depart from zero (in a direction associated with which of its voltage input ports 41 and 42 is relatively higher).

As pointed out briefly above, this complementary apportioning of the difference between the power supply rails (e.g., Vcc and GND) as the drive inputs to the thermo-electric cooler 40 makes control of the thermo-electric cooler effectively insensitive to fluctuations in the power supply voltages. Thus, the thermal output of the thermo-electric cooling element 40 (heating or cooling) is readily changed by controllably increasing or decreasing the duty cycle of the PWM 10, which causes equal and opposite linear changes in the duty cycles of its complementary output waveforms. As this allows a relatively small change in the input control voltage to the PWM 10 to produce a substantial change in the differential drive to the thermo-electric cooler 40, feeding back the output voltage produced by the thermistor 72 as an error voltage readily provides closed loop servo control of the DC input voltage applied to the PWM 10.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed is:

1. A driver circuit for controlling the operation of a thermo-electric cooling element comprising:

a pulse width modulator which is operative to generate an output signal waveform having a duty cycle proportional to a control voltage applied thereto; and an interface circuit adapted to be coupled to power supply voltages for operating said thermo-electric cooler, and being operative to establish a differential voltage across first and second drive terminals of said thermo-electric cooling element that is proportional to the duty cycle of said output signal waveform generated by said pulse width modulator.

2. A drive circuit according to claim 1, wherein said pulse width modulator which is operative to generate complementary versions of said signal waveform, and wherein said interface circuit includes first and second switching circuits, coupled to receive respective ones of said complementary versions of said signal waveform, and being operative to controllably apportion said power supply voltages as said differential voltage to first and second drive terminals of said thermo-electric cooling element, in linear proportion to the duty cycle of said complementary versions of said signal waveform.

3. A driver circuit according to claim 1, wherein said interface circuit includes a first pair of complementary switching elements, coupled in circuit with first and second power supply terminals, and having control terminals thereof coupled to a first output of said pulse width modulator and outputs thereof coupled to said first drive terminal of said thermo-electric cooling element, and a second pair of complementary switching elements, coupled in circuit with said first and second power supply terminals, and having control terminals thereof coupled to a second output of said pulse width modulator and outputs coupled to said second drive terminal of said thermo-electric cooling element, so as to establish, with said first pair of complementary switching elements, said differential voltage across said first and second terminals of said thermo-electric cooling element.

4. A driver circuit according to claim 3, wherein outputs of said first and second pairs of complementary switching elements are coupled through respective low pass filters to said first and second terminals of said thermo-electric cooling element.

5. A driver circuit according to claim 1, wherein said thermo-electric cooling element is coupled to a laser device.

6. A driver circuit according to claim 1, further including a temperature-sensing element adapted to be coupled to a device that is temperature-controlled by said thermo-electric cooling element, and being operative to provide an output voltage in accordance with a thermal input thereto, said output voltage being coupled over a feedback loop to be combined with said control voltage applied to said pulse width modulator.

7. A driver circuit according to claim 6, further including a low pass filter through which said control voltage is applied to said pulse width modulator, and being operative to remove switching frequency components of said signal waveform from said control voltage.

8. A driver circuit according to claim 6, wherein said device that is temperature-controlled by said thermo-electric cooler comprises a laser device.

9. A method of controlling the operation of a thermo-electric cooling element comprising the steps of:
  (a) generating a signal waveform having a duty cycle proportional to a control voltage;
  (b) coupling across first and second terminals of said thermo-electric cooling element a differential voltage that is operative to establish a thermal characteristic of said thermo-electric cooling element in linear proportion to the duty cycle of said signal waveform.

10. A method according to claim 9, wherein said thermo-electric cooling element is coupled to a laser device.

11. A method according to claim 9, wherein step (a) further includes adjusting said control voltage in accordance with the temperature of a device that is temperature-controlled by said thermo-electric cooler.

12. A method according to claim 9, wherein step (a) comprises generating complementary versions of said signal waveform, and wherein step (b) comprises establishing said differential voltage across said first and second terminals of said thermo-electric cooling element in accordance with said complementary versions of said signal waveform.

13. A method according to claim 12, wherein step (b) comprises coupling a first and second pairs of complementary switching elements in circuit between first and second power supply terminals and said first and second terminals of said thermo-electric cooling element, and controlling power supply switching paths therethrough in accordance with complementary versions of said signal waveform.

14. A method according to claim 13, wherein outputs of said first and second pairs of complementary switching elements are coupled through respective low pass filters to said first and second terminals of said thermo-electric cooling element.

15. A method according to claim 9, further including a temperature-sensing element adapted to be coupled to a device that is temperature-controlled by said thermo-electric cooler, and being operative to provide an output voltage in accordance with a thermal input thereto, said output voltage being coupled over a feedback loop to be combined with said control voltage applied to said pulse width modulator.

16. A method according to claim 15, further including a low pass filter through which said control voltage is applied to said pulse width modulator, and being operative to remove switching frequency components of said complementary signal waveforms from said control voltage.

17. A method according to claim 15, wherein said device that is temperature-controlled by said thermo-electric cooler comprises a laser device.

* * * * *